March 15, 1966 A. E. E. IRMISCH 3,240,952

BLOCKING OSCILLATOR WITH PREMAGNETIZED TRANSFORMER CORE EMPLOYING POSITIVE AND NEGATIVE FEEDBACK

Filed July 9, 1962

INVENTOR

ARNDT E. E. IRMISCH

BY Philip M. Bolton

ATTORNEY

United States Patent Office 3,240,952
Patented Mar. 15, 1966

3,240,952

BLOCKING OSCILLATOR WITH PREMAGNETIZED TRANSFORMER CORE EMPLOYING POSITIVE AND NEGATIVE FEEDBACK

Arndt Ernst Eugen Irmisch, Stuttgart-Zuffenhausen, Germany, assignor to International Standard Electric Corporation, New York, N.Y., a corporation of Delaware Filed July 9, 1962, Ser. No. 208,543
Claims priority, application Germany, July 12, 1961, St 18,060
7 Claims. (Cl. 307—88.5)

Figure 1:
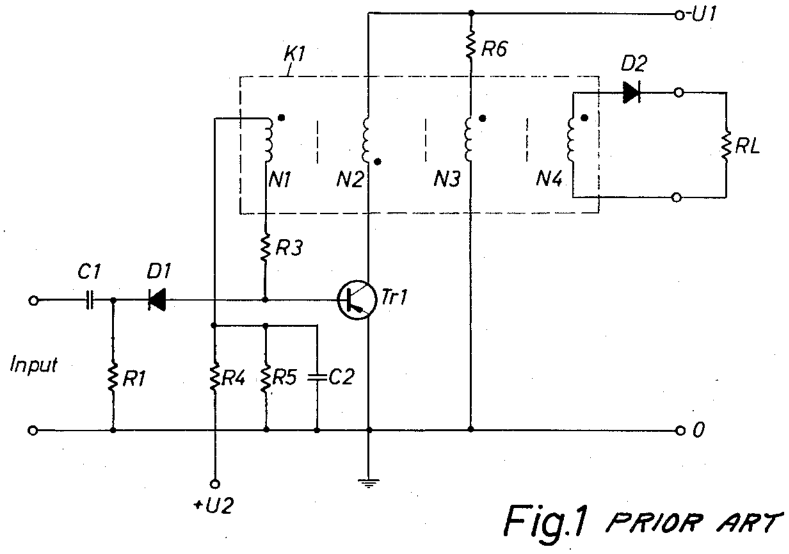
Fig.1 PRIOR ART

The present invention relates to a transistorized blocking oscillator which, independently of the load and of the ratings of the transistors, delivers pulses of a defined amplitude and duration.

Transistorized blocking oscillators are known in which the transformer core operates within the linear range of the magnetizing curve. In these embodiments, however, the duration of the produced pulses is considerably dependent upon the load and upon the transistor ratings, especially upon the current amplification.

Moreover, blocking oscillators are known in which the fluctuations of the current amplification as well as the load variations have a reduced influence upon the pulse duration. In the case of these oscillators the transformer core is driven into the saturation area, and the pulse duration is extensively determined by the saturation behaviour of the transformer core, under the condition that certain limits of dimensioning are adhered to. If the current amplification of the transistor is too low and/or if the load is too high, the transistor is no longer bottomed before the end of the pulse duration, and the output amplitude drops off prematurely which, at the same time, has an effect upon the pulse duration. In the opposite case, when the current amplification is too high and/or the load is too low, the transistor is overdriven to a considerable extent, and at the end of the pulse a considerable charge is still stored in the base electrode, so that the power loss in the transistor is very high during the trailing edge of the pulse. It is due to the increased power loss and the extension of the storage time that the maximum obtainable pulse frequency is considerably reduced.

It is the object of the present invention to avoid the aforementioned disadvantages of the hitherto conventional types of blocking oscillators.

The invention proposes a transistorized blocking oscillator which, at a very low power loss of the transistor, and a very short storage time of the base charge, produces an output pulse which is extensively independent of the magnitude of the connected load and of the transistor ratings.

The general idea of the invention is a transistorized blocking oscillator comprising a transistor having emitter, base and collector electrodes, including first positive feedback means coupled between said collector and base electrodes, means for receiving and applying input pulses between said base and emitter electrodes, and second negative feedback means, coupled between said collector and base electrodes, for feeding back current limiting signals from said collector to said base as soon as the amplitude of the collector current has reached a predetermined value, after an input pulse has been applied.

A blocking oscillator of the conventional type, employing a transistor and a transformer core, which is operated into the saturation area, is substantially improved in that there is provided an additional second feedback path including a second ferrite core consisting of a material having an approximately rectangular hysteresis loop, the primary winding of which being arranged within the collector circuit of the transistor, and via the secondary winding of which the core is premagnetized up into the saturation area via a current-limiting resistance, and in that at the same time this secondary winding is connected via a diode, in such a way to the base circuit that the collector current passing through the primary winding of this second core, from a certain amplitude onwards, which is capable of being determined by dimensioning the premagnetizing current, will change the core into the opposite state of magnetization, with the voltage induced in the secondary winding in the course of this, being introduced to the base circuit as a negative feedback voltage, so that on account of this the collector current will be limited and, at the same time, the base charge will be withdrawn more rapidly.

By inserting a further transformer, a diode, and a resistor into the hitherto conventional type of circuit arrangement it will be possible to substantially reduce the storage time of the overdriven transistor, to reduce the collector current during the storage time and, consequently, to reduce the transistor losses to a considerable extent.

Although the maximum pulse frequency can already be increased by the reduced storage time, the reduced power loss of the transistor permits the use of transistors having a higher cut-off frequency which, in most cases, have the disadvantages of allowing only a lower dissipation.

Figure 2:
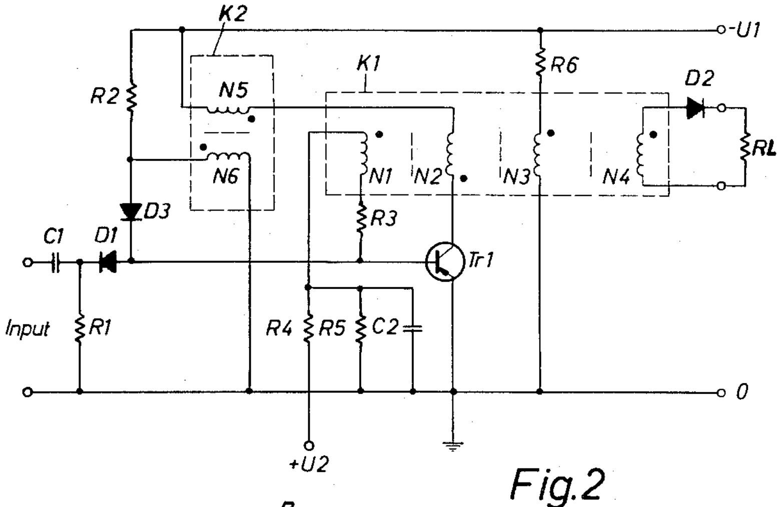
Figure 3:
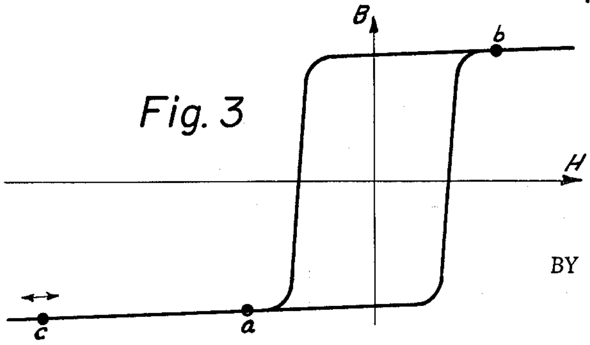

The invention will now be explained in detail with reference to FIGS. 1–3 of the accompanying drawings, in which:

FIG. 1 shows a blocking oscillator of the conventional type, in which the transformer core is operated up into the saturation area, FIG. 2 shows the inventive type of blocking oscillator, and FIG. 3 is the rectangular hysteresis loop of a magnetic core shown for explanatory reasons in connection with the description of the drawings.

In the conventional arrangement of a blocking oscillator as shown in FIG. 1, the transformer core $K_1$ is premagnetized via the winding $N_3$ that it is a point *a* of the hysteresis loop (see FIG. 3). If the blocking oscillator is now acted upon by a negative pulse applied, via the capacitor $C_1$ and the diode $D_1$, to the base electrode of the transistor, the latter will be temporarily unblocked. The resulting collector current, via the winding $N_2$, will now magnetize the core in the direction *b* (FIG. 3). The voltage as induced in the feedback winding $N_1$ causes a positive feedback. The transistor will remain to be bottomed as long as a voltage is induced in this winding $N_1$, hence until the core $K_1$ has reached its saturation at the point *b* (FIG. 3). From this time position onwards no voltages are induced via the windings of the core $K_1$; hence the transistor is no longer bottomed.

As a rule, the following is applicable:

$$\int u_{N2} \cdot dt = N_2 \cdot q \cdot \Delta B$$

Since, in the case of a bottomed transistor $u_{N2} = U_1 =$ const., it is possible to set up the following:

$$\int u_{N2} \cdot dt = U_1 \cdot \tau$$

Hence, there will result:

$$\tau = \frac{N_2 \cdot q \Delta B}{U1}$$

Accordingly, the magnetization time is dependent upon the collector current and, consequently, upon the load current flowing through the load resistor RL as well as upon the base current, that is, upon the current amplification, as long as the collector-emitter residual voltage during the bottoming is small with respect to $U_1$, so that also $u_{N2}$ approximately equals $U_1$. In other words, a voltage is impressed upon the winding $N_2$. Subsequently to the termination of the re-magnetization, and as soon as the transistor is blocked, the core is reset on account of the premagnetization. The voltage as induced via $N_4$, may now be loaded with a load resistor RL via a diode $D_2$.

In order to obtain steep edges of the output pulse, in other words, in order to achieve a quick charging of the base electrode, the transistor must be overdriven at the beginning. The base current flowing during the re-magnetization serves to charge the capacitor $C_2$. The positive feedback voltage $u_{C2}+u_{N1}$ which is used to control the base electrode of the transistor, will thus become smaller towards the end of the re-magnetization process, thus also causing the over-excitation to be reduced.

In the case of a given load current and a given current amplification of the transistor, it is possible, theoretically, to dimension the circuit arrangement in such a way that the transistor will be no longer overdriven at the end of the re-magnetization process. After the feedback voltage has suffered a breakdown via the winding $N_1$, the slight base charge is quickly dissipated with the aid of the charged capacitor $C_2$. Accordingly, also the collector current will die away quickly. Hence, the energy as fed into the transistor during the period of the trailing edge, is a relatively small one.

In practice, however, it is impossible to carry out such an optimum dimensioning. The demand for a constant load is rather inconvenient, and can only be met in some cases. It is still far more difficult to ensure an exactly defined and timely constant current amplification of the transistor. To this end it would be necessary to provide an artificial ageing and narrow current-amplification tolerances.

If the load current is too high and/or the current amplification too small, then the transistor is no longer completely bottomed at the end of the re-magnetization, hence the necessary impression of voltage via $N_2$ is omitted. However, if the load current is too small and/or the current amplification is too high, then the transistor is still overdriven to a strong extent at the end of the re-magnetization process. The discharge of the base is only performed slowly. This requires that the energy consumed via the collector-base path be high.

In view of the fact that optimum dimensions of the circuit arrangement are practically unobtainable, circuit arrangements of the described type have been dimensioned in accordance with the last mentioned critical case; in other words: a strong over-excitation has been chosen in order to ensure that the transistor will remain to be reliably bottomed during the pulse period, thus allowing for certain current amplification and load variations. This, however, was entailed by increased transistor losses, so that the transistor had to be dimensioned in accordance with this maximum consumed energy.

FIG. 2 shows the inventive embodiment of a transistorized blocking oscillator.

This is an arrangement which has been derived from the conventional arrangement according to FIG. 1 in which, according to the invention, a second feedback path has been inserted for causing a limitation of the collector current from a certain amplitude onwards. From this there results an increase of the switching speed and a reduction of the power loss.

The core $K_2$ consisting of a material having an almost rectangular hysteresis loop, is pre-magnetized via the winding $N_6$ as to be far within the saturation area (point *c* in FIG. 3). By selecting $R_2$ correspondingly, the point *c* (FIG. 3) may be assigned to any suitable field intensity within the range of the lower saturation branch of the hysteresis loop.

A negative pulse applied to the input lead, is fed to the base electrode of the transistor via the capacitor $C_1$ and the diode $D_1$. The transistor will be bottomed, and a collector current will be flowing. This current passes through both the winding $N_2$ of core $K_1$ and the winding $N_5$ of core $K_2$. The core $K_1$ which was initially in the state *a* on account of the pre-magnetization, will now be re-magnetized by the collector current and changed to the condition *b* (FIG. 3).

If, in the blocking oscillator circuit which is overdriven by the feedback, and subsequently to the re-magnetization of the core $K_1$, the collector current assumes a steep rise, there will result a freely selectable amplitude of the collector current at which the core $K_2$ will reach the state of magnetization *b* (FIG. 3). At the moment of reaching this point *b*, there is started the re-magnetization of $K_2$, and the collector current is limited from this moment on. The voltage as induced in the winding $N_6$ of $K_2$ acts as a negative feedback voltage upon the base-emitter path of the transistor, i.e. via the diode $D_3$; the energy as transformed from the collector circuit, serves to rapidly discharge the base.

Accordingly, on account of this second feedback path, the feedback as resulting from the two branches, and up to a definable amplitude of the collector current, will act as a positive feedback, and from this threshold value onwards, as a negative feedback. On account of this, the collector current is prevented from rising further, and is limited to this definable value.

Instead of using a pnp-type transistor as in this example, it is also possible to use an npn-type transistor when providing for the necessary polarity reversal of the corresponding circuit elements and sources of power supply.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A transistor blocking oscillator comprising:
a transistor having emitter, base and collector electrodes;
positive feedback means including a first transformer coupled between said collector and base electrodes;
means for receiving and applying input pulses between said base and emitter electrodes;
negative feedback means including a second separate transformer having a magnetic core coupled between said collector and base electrodes; and
means for magnetically biasing the core of said second transformer so as to render it inoperative until the amplitude of the collector current has reached a predetermined threshold value after an input pulse has been applied.

2. A transistorized blocking oscillator as in claim 1 wherein said first and second feedback means include transformer cores characterized by substantially rectangular hysteresis loops.

3. A transistorized blocking oscillator comprising:
a source of supply voltage including a reference potential;
a transistor having emitter, base and collector electrodes, said emitter electrode being coupled to said reference potential;
a first magnetic core having first, second, third and fourth windings;
a second magnetic core having first and second windings;
a source of bias voltage;
means to apply input pulses to said base electrode of said transistor; and
an output utilization device;
said first winding of said first magnetic core being coupled between the reference potential and the supply voltage for premagnetizing said first core, said second winding of said first core being coupled between said collector electrode and the supply voltage, said third winding of said first core being coupled between said base electrode and said source of bias voltage for providing positive feedback to said base electrode, said fourth winding of said first core being coupled to said output utilization device, said first winding of said second core being coupled between said collector electrode and the supply voltage, said second winding of said second core being coupled between the supply voltage and the reference potential to premagnetize said second core and being further coupled to said base electrode for providing negative feedback to said base electrode after the collector current has exceeded a predetermined value.

4. A transistorized blocking oscillator as in claim 3 wherein said first and second cores can be premagnetized into saturation.

5. A transistorized blocking oscillator as in claim 4 wherein said cores are composed of a material characterized by a substantially rectangular hysteresis loop.

6. A transistorized blocking oscillator as in claim 5 wherein a resistance is connected in series with said second winding of said second core to limit the premagnetizing current to prevent said second core from switching until current flowing in the collector circuit of said transistor exceeds a predetermined amplitude.

7. A transistorized blocking oscillator comprising:

a source of supply voltage including a reference potential;

a transistor having emitter, base and collector electrodes and having a predetermined storage time, said emitter electrode being coupled to said reference potential;

a first magnetic core consisting of a material having an approximately rectangular hysteresis loop and having first, second, third and fourth windings;

a second magnetic core consisting of a material having an approximately rectangular hysteresis loop and having first and second windings;

a source of bias voltage;

means to apply input pulses to said base electrode of said transistor; and an output utilization device;

said first winding of said first core being coupled between the reference potential and the supply voltage for premagnetizing said first core into saturation, said second winding of said first core being coupled between the supply voltage and said collector electrode, said third winding of said first core being coupled between said source of bias voltage and said base electrode for providing positive feedback to said base electrode, said fourth winding of said first core being coupled to said output utilization device, said first winding of said second core being coupled between the supply voltage and said collector electrode, said second winding of said second core being coupled between the reference potential and the supply voltage for premagnetizing said second core into saturation in one state of magnetization and said second winding of said second core being further coupled to said base electrode whereby said second core will go into an opposite state of magnetization when the collector current flowing through said first winding of said second core exceeds a predetermined value, thereby inducing a voltage in said second winding of said second core which is applied as a negative feedback voltage to said base electrode to limit the collector current and reduce the storage time of said transistor.

References Cited by the Examiner

UNITED STATES PATENTS

| | | | |
|---|---|---|---|
| 2,886,706 | 5/1959 | Rogers | 331—148 |
| 3,072,802 | 1/1963 | Myers et al. | 307—88.5 |
| 3,155,843 | 11/1964 | Levinson | 331—112 |

DAVID J. GALVIN, *Primary Examiner.*

ARTHUR GAUSS, *Examiner.*